United States Patent [19]

Iwasaki

[11] Patent Number: 6,026,225

[45] Date of Patent: Feb. 15, 2000

[54] METHOD OF LAYOUT OF SEMICONDUCTOR INTEGRATED CIRCUITS

[75] Inventor: Tadashi Iwasaki, Tokyo, Japan

[73] Assignee: NEC Corporation, Tokyo, Japan

[21] Appl. No.: 08/900,666

[22] Filed: Jul. 25, 1997

[30] Foreign Application Priority Data

Jul. 25, 1996 [JP] Japan ..................................... 8-195924

[51] Int. Cl.[7] .................................................. G06F 17/50
[52] U.S. Cl. .................................. 395/500.11; 395/500.1; 395/500.06; 395/500.15
[58] Field of Search .................................. 364/488–491, 364/578; 395/500.09–500.159

[56] References Cited

U.S. PATENT DOCUMENTS

| | | | |
|---|---|---|---|
| 5,568,395 | 10/1996 | Huang ................................. | 395/500.05 |
| 5,610,833 | 3/1997 | Chang et al. ....................... | 395/500.12 |
| 5,638,288 | 6/1997 | Deeley ................................ | 395/500.13 |
| 5,666,290 | 9/1997 | Li et al. .............................. | 395/500.09 |
| 5,787,268 | 7/1998 | Sugiyama et al. .................. | 395/500.12 |

FOREIGN PATENT DOCUMENTS 3-196661 8/1991 Japan ............................. H01L 21/82
9-213806 8/1997 Japan ............................. H01L 21/82

OTHER PUBLICATIONS

Youssef et al. ("Critical path issue in VLSI design", 1989 IEEE International Conference on Computer–Aided Design, ICCAD–89, Digest of Technical Papers, pp. 520–523, Nov. 5, 1989).

Dunlop et al. ("Chip Layout Optimization Using Critical Path Weighting", Paper 9–2, ACM/IEEE 21st Design Automation Conference, Jan. 1984).

*Primary Examiner*—Kevin J. Teska
*Assistant Examiner*—Phallaka Kik
*Attorney, Agent, or Firm*—Young & Thompson

[57] ABSTRACT

A method of laying out a semiconductor integrated circuit includes executing a schematic placement of a plurality of function cells realizing fundamental logics for a schematic routing between input/output terminals of the function cells; executing a simulation of circuit operations under virtual load conditions in consideration of a schematic length of interconnection; extracting any interconnections as critical paths from the results of the simulation; and executing detailed routing under conditions that a distance between the interconnection extracted as the critical path and an adjacent interconnection to the critical path is wider than a distance between the remaining interconnections.

15 Claims, 7 Drawing Sheets

METHOD OF LAYOUT OF SEMICONDUCTOR INTEGRATED CIRCUITS

BACKGROUND OF THE INVENTION

The present invention relates to a layout method for semiconductor integrated circuits, and more particularly to a routing method for semiconductor integrated circuits such as application specific integrated circuits.

The semiconductor integrated circuits such as application specific integrated circuits (ASIC) may often be designed in the gate array approach or the standard cell approach. For the circuit design by the gate array approach or the standard cell approach, function cells realizing fundamental logics have previously been prepared in a design library for automatic placements of the function cells in support of computer aided design and subsequent automatic routing between the function cells to design the logic circuits.

Figure 1:
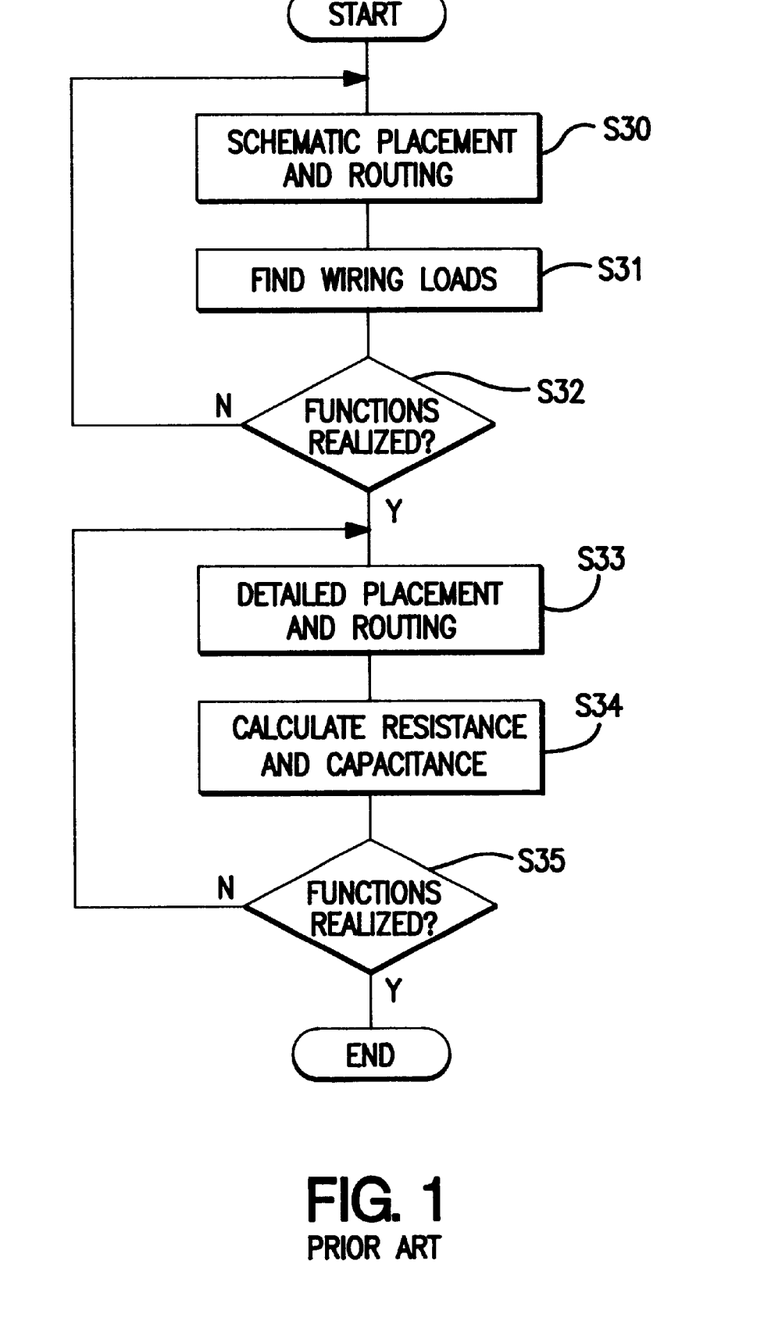
FIG. 1 is a flow chart illustrative of the conventional automatic placement and routing method to be applied to large scale integrated circuits.

FIG. 1 is a flow chart illustrative of the conventional automatic placement and routing method to be applied to large scale integrated circuits. In Step S30, schematic placement and routing are made in consideration of the length of wirings between the functional cells and density of the wirings. In the next Step S31, wiring loads are virtually found from schematic wiring information such as Manhattan length for executing a virtual load simulation to verify operation of the circuits. In the next Step S32, it is verified whether or not the required or intended functions are realizable and if realizable, then the process enters into the next Step S33 whilst if not realizable, then the process enters back into the former Step S30. In the Step S33, detailed placement and routing are made. In the subsequent Step S34, a resistance and a capacitance of the real wiring are calculated for execution of the real wiring simulation to verify the detailed operations of the circuits. In the Step S35, it is verified whether the required or intended functions are realizable and if realizable, then the layout processes will be completed whilst if not realizable, then the process enters back to the former step S33.

Figure 2:
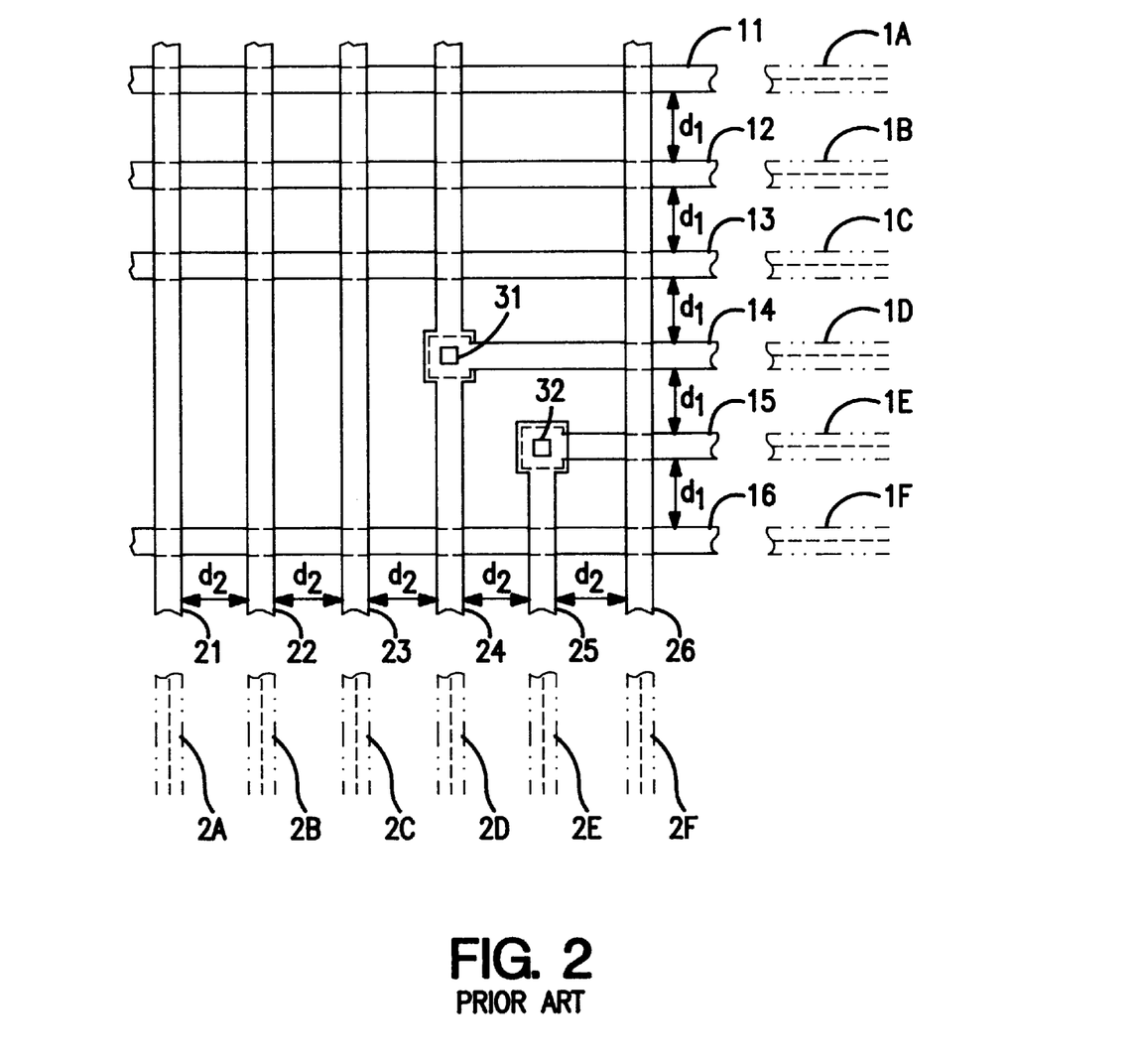
FIG. 2 is a diagram illustrative of the conventional routing layouts in detail.

FIG. 2 is a diagram illustrative of the conventional routing layouts in detail. First level interconnection channels 1A, 1B, 1C, 1D, 1E and 1F extend in the row direction at a first constant pitch "d1". Second level interconnection channels 2A, 2B, 2C, 2D, 2E and 2F extend in the column direction at a second constant pitch "d2". The second level interconnection channels 2A, 2B, 2C, 2D, 2E and 2F extend in the vertical direction to the first level interconnection channels 1A, 1B, 1C, 1D, 1E and 1F. First level interconnections 11, 12, 13, 14, 15 and 16 are provided which extend on the first level interconnection channels 1A, 1B, 1C, 1D, 1E and 1F respectively. Second level interconnections 21, 22, 23, 24, 25 and 26 are provided which extend on the second level interconnection channels 2A, 2B, 2C, 2D, 2E and 2F respectively. The first level interconnections 11, 12, 13, 14, 15 and 16 are aligned in the first pitch "d1" whilst the second level interconnections 21, 22, 23, 24, 25 and 26 are aligned in the second pitch "d2". Through holes 31 and 32 are provided which connect the first interconnections 11, 12, 13, 14, 15 and 16 and the second interconnections 21, 22, 23, 24, 25 and 26.

As in the recent years micro-lithography techniques have been developed which make it possible to reduce the with and pitch of the interconnections down to 1 micrometers respectively. The reduction in pitch between the interconnections in the same level raises the serious problem with increase parasitic capacitance between the adjacent interconnections. If two adjacent interconnections of 1 micrometer in width and of 1 micrometer in thickness are aligned in a pitch of 1 micrometer over a silicon oxide film having a thickness of 2 micrometers formed over a silicon substrate and further a silicon oxide inter-layer insulator is formed which extends over the interconnections and over the silicon oxide film over the silicon substrate, then a total capacitance of a single signal interconnection is 0.24 pF/mm whilst the parasitic capacitance of between the adjacent two interconnections is 0.14 pF/mm. This means that the parasitic capacitance between the adjacent two interconnections is 60% of the total capacitance of the single signal interconnection. This results in time delays of signal transmission on the interconnection. This limits high frequency performance of the integrated circuits. If the desired high frequency performance can not be obtained, the Step S33 of the placement and routing processes should be made frequently until the desired high frequency performance can be obtained.

Figure 3:
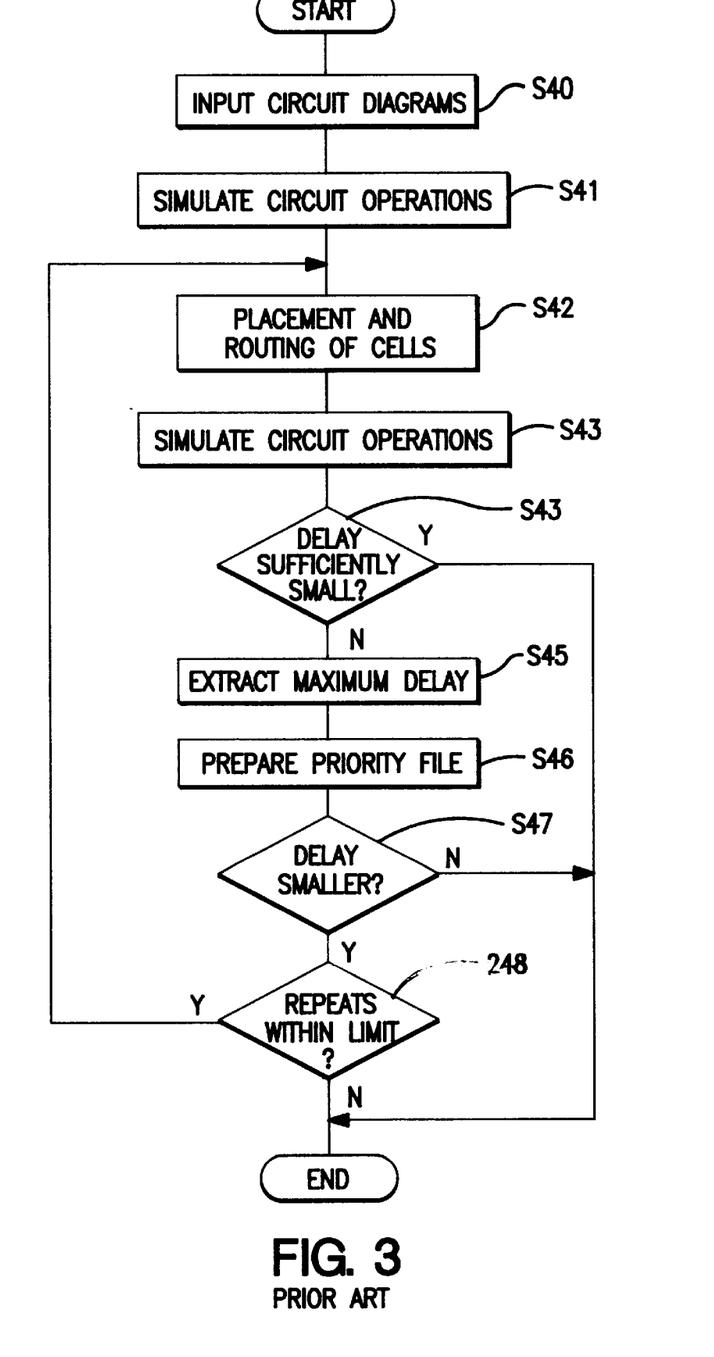
FIG. 3 is a flow chart illustrative of the other conventional layout method.

In order to settle the above problem, it was proposed in the Japanese laid-open patent publication No. 4-333980 to execute placement and routing processes frequently so that the length of the interconnections of a delay-value maximum net is possibly shortened. FIG. 3 is a flow chart illustrative of the other conventional layout method. In the Step S40, circuit diagrams of the semiconductor integrated circuits are inputted. In the next Step S41, circuit operations are simulated without consideration of resistance and capacitance of the interconnections for subsequent storing data as the results of a virtual simulation. In the Step S42, automatic placement and routing of function cells are executed. In the Step S43, circuit operations are simulated in consideration of the resistance and capacitance of the interconnections as a real simulation. In the next Step S44, there is made a compression between the above virtual simulation made without consideration of resistance and capacitance of the interconnections and the real simulation made in consideration of resistance and capacitance of the interconnections to verify whether the delay in time of signal transmission on the interconnections is sufficiently small or not. If sufficiently small, then the layout processes have been completed and if not sufficiently small, then the layout processes enters into the Step S45. In the Step S45, an interconnection causing a maximum delay in time of signal transmission is extracted. In the subsequent Step S46, a priority file is prepared wherein the highest priority is assigned to the placement order of the interconnection pattern causing the maximum delay in time of the signal transmission. In the Step S47, it is verified whether the delay in time to the signal transmission obtained by the comparison of the virtual and real simulations is smaller than the past delay in time the signal transmission. If larger than the past delay, then the layout processes have been completed. If, however, of the delay is smaller than the previous delay, the layout processes enter into the Step S48. In the Step S48, it is confirmed whether the number of repeats is within a predetermined number and if within the predetermined number, then the layout processes returns back to the Step S42 so that the automatic placement of the interconnection patterns are made in accordance with the order of priority. If, however, the number of repeats exceeds the predetermined number, then the layout processes have been completed.

The above conventional layout method has the following disadvantages, particularly when the interconnections are scaled down. If the pitch of the interconnections is reduced, then the parasitic capacitance between the two adjacent interconnections exceeds the capacitance of the individual interconnection, for which reason even if the capacitance of the individual interconnection is reduced by reduction in length of the individual interconnection by the above layout process, then it is no longer possible to obtain a sufficient reduction in the total capacitance of the parasitic capacitance between the two adjacent interconnections and the capacitance of the individual interconnection. This results in an increase in the number of repeating the placement and routing processes to shorten the individual interconnections. In order to reduce the repeating of the placement and routing processes, it is required to make a design in consideration of sufficient margin. This, however, results in lowering the degree of integration of the semiconductor circuits and in increase in the area of the chip.

Figure 4:
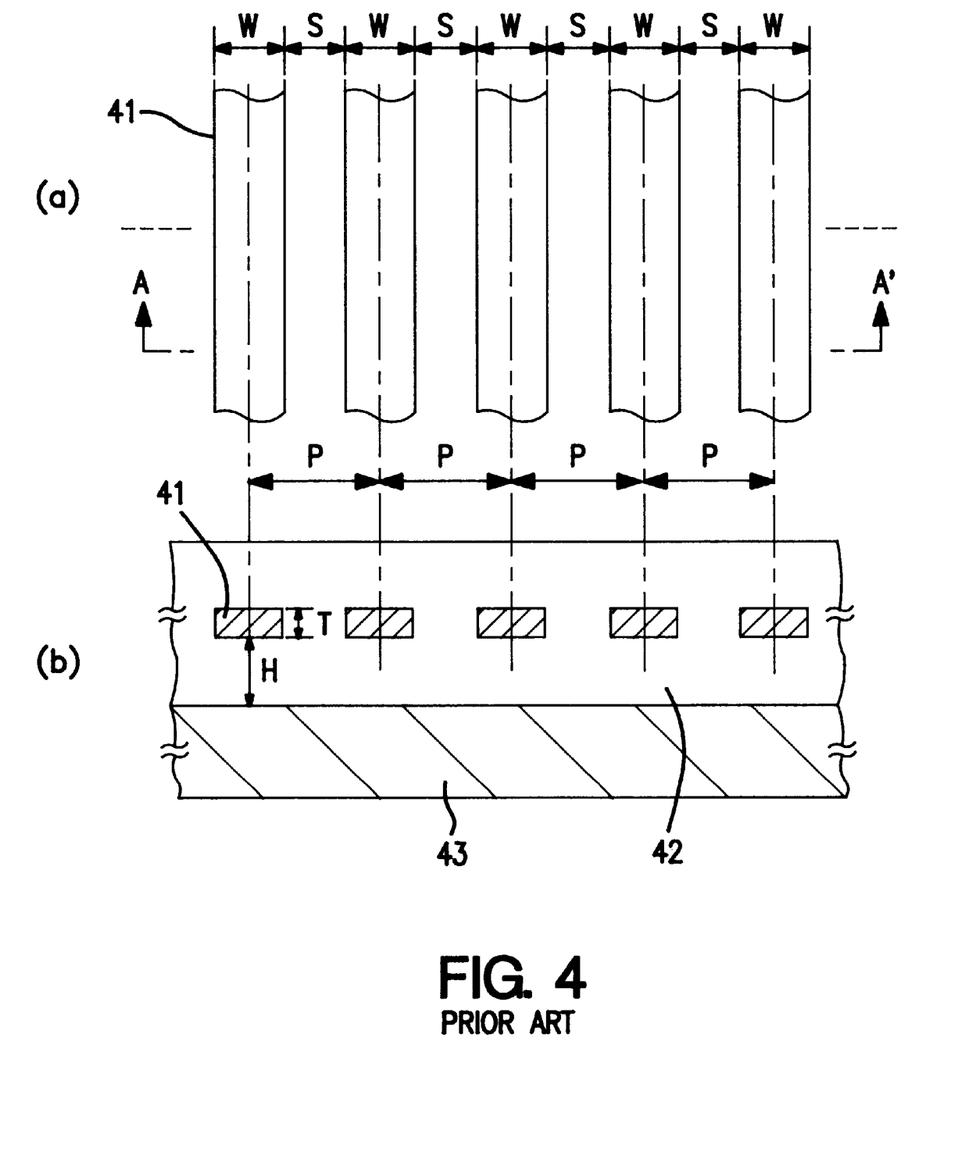
FIG. 4 is a fragmentary lane and cross sectional views illustrative of the layout of the interconnections in the above still other conventional layout method.

Still another conventional layout method was proposed and disclosed in the Japanese laid-open patent publication No. 2-68933, wherein the pitch of the interconnections is fixed whilst the width of the interconnections is optimized so that the delay in time of the signal transmission is minimized under the condition that the length of the interconnections has the maximum. FIG. 4 is a fragmentary lane and cross sectional views illustrative of the layout of the interconnections in the above layout method. Interconnections 41 are provided which extend in parallel to each other and within an insulation film 42 formed over a semiconductor substrate 43. The interconnections 41 have a thickness of "T" and a width of "W". The interconnections 41 are aligned at a pitch of "P" and a distance "S" between them. The thickness of the insulation layer 42 between the bottoms of the interconnections 41 and the top surface of the semiconductor substrate 43 is defined as "H". The pitch "P" of the interconnection is fixed. Assuming that the length of the interconnections has the maximum, the width "W" of the interconnection is analyzed in consideration of the resistance and capacitance of the interconnections so that the delay in time of the signal transmissions on the interconnections is minimum.

The above layout method has the following disadvantages. If the pitch of the interconnections is fixed to be narrow, then the influence of the parasitic capacitance between the adjacent two interconnections dominates the capacitance of the individual to interconnection whereby it is difficult to obtain a sufficient reduction in total capacitance of the interconnections. This results in an increase in the delay in time of the signal transmissions. Under the condition of narrower pitch of the interconnections, it is difficult to find out the optimum width of the interconnections. Widening the pitch of the interconnections is essential to obtain a sufficient reduction in time delay of signal transmissions on the interconnections.

Under the above circumstances, it had been required to develop a novel layout method which enables the time for layout process to be shortened and allows a high density integration or scaling down the semiconductor integrated circuits.

SUMMARY OF THE INVENTION

Accordingly, it is an object of the present invention to provide a novel layout method free from the above problems.

It is a further object of the present invention to provide a novel layout method which shortens the layout process time.

It is a still further object of the present invention to provide a novel layout method which allows a high density integration or scaling down of the semiconductor integrated circuits.

The above and other objects, features and advantages of the present invention will be apparent from the following descriptions.

In accordance with the present invention, after schematic placement and routing processes have been executed, a virtual load simulation is made to extract critical paths and then detailed placement and routing processes will be made so that a distance between an interconnection to be the critical path and an adjacent interconnection to the critical pass is wider by two times or more than a distance the remaining interconnections.

In the first step, a schematic placement of a plurality of function cells realizing fundamental logics is executed for a schematic routing between input/output terminals of the function cells.

In the second step, a simulation of circuit operations is made under virtual load conditions in consideration of a schematic length of interconnection.

In the third step, an interconnection is extracted as a critical path from the results of the simulation made in the second step.

In the fourth step, detailed placement and routing are made under the conditions that a distance between the interconnection extracted as the critical path and an adjacent interconnection to the critical pass is wider than a distance between the remaining interconnections.

After schematic placement and routing processes have been executed, a virtual load simulation is made to extract critical paths and then detailed placement and routing processes will be made so that a distance between an interconnection to be the critical path and an adjacent interconnection to the critical path is wider by two times or more than a distance the remaining interconnections so as to reduce a parasitic capacitance between the interconnections of a large delay in time of signal transmission thereon. This allows the time for layout process to be shortened for obtaining the desired functions.

BRIEF DESCRIPTION OF THE DRAWINGS

Preferred embodiments according to the present invention will be described in detail with reference to the accompanying drawings.

DISCLOSURE OF THE INVENTION

The present invention provides a method of laying out a semiconductor integrated circuit comprising the steps of: executing a schematic placement of a plurality of function cells realizing fundamental logics for a schematic routing between input/output terminals of the function cells; executing a simulation of circuit operations under virtual load conditions in consideration of a schematic length of interconnection; extracting any interconnections as critical paths from the results of the simulation made in the second step; and extracting detailed routing under conditions that a distance between the interconnection extracted as the critical path and an adjacent interconnection to the critical path is wider than a distance between the remaining interconnections.

It is preferable that a predetermined number of interconnections selected in the order of magnitude of signal transmission delay be extracted.

It is also preferable that all of the interconnections having signal transmission delays larger than a predetermined threshold value be extracted.

It is preferable to further comprise the steps of: after extracting detailed routing, executing simulation of circuit operations under real interconnection loads calculated from resistance and capacitance of the interconnections; and verifying whether desired performances of the circuits are obtained.

It is preferable to further comprise the step of executing detail placement of the function cells after executing the simulation of the circuit operations under the virtual load conditions.

It is preferable to further comprise the step of executing detail placement of the function cells after extracting any interconnections as critical paths.

The present invention provides a method of layout of a semiconductor integrated circuit comprising the steps of: executing a schematic placement of a plurality of function cells realizing fundamental logics in consideration of a density of distribution for a subsequent schematic routing between input/output terminals of the function cells; executing a simulation of circuit operations under virtual load conditions in consideration of a schematic length of interconnection; verifying whether desired performances can be obtained from the results of the simulations made in the second step; extracting a predetermined number of interconnections selected in the order of signal transmission delay from the results of the simulation made in the second step; executing detailed placement of the function cells; verifying whether the interconnection to be placed would be a critical path or not; executing a detailed routing for the extracted interconnections as the critical paths under conditions that a distance between the interconnection extracted as the critical path and an adjacent interconnection to the critical path is wider than a distance between the remaining interconnections; executing another detailed routing for the non-extracted interconnections at a predetermined normal pitch; executing a simulation of circuit operations under real interconnection loads calculated from resistance and capacitance of the interconnections; and verifying whether the desired performances of the circuits have be obtained.

The present invention provides a method of layout of a semiconductor integrated circuit comprising the steps of: executing a schematic placement of a plurality of function cells realizing fundamental logics in consideration of a density of distribution for a subsequent schematic routing between input/output terminals of the function cells; executing a simulation of circuit operations under virtual load conditions in consideration of a schematic length of interconnection; verifying whether desired performances can be obtained from the results of the simulations made in the second step; extracting all of the interconnections having signal transmission delays larger than a predetermined threshold value from the results of the simulation made in the second step; executing detailed placement of the function cells; verifying whether the interconnection to be placed would be a critical path or not; executing a detailed routing for the extracted interconnections as the critical paths under conditions that a distance between the interconnection extracted as the critical path and an adjacent interconnection to the critical path is wider than a distance between the remaining interconnections; executing another detailed routing for the non-extracted interconnections at a predetermined normal pitch; executing a simulation of circuit operations under real interconnection loads calculated from resistance and capacitance of the interconnections; and verifying whether the desired performances of the circuits have be obtained.

The present invention provides a method of layout of a semiconductor integrated circuit comprising the steps of: executing a schematic placement of a plurality of function cells realizing fundamental logics in consideration of a density of distribution for a subsequent schematic routing between input/output terminals of the function cells; executing a simulation of circuit operations under virtual load conditions in consideration of a schematic length of interconnection; verifying whether desired performances can be obtained from the results of the simulations made in the second step; executing detailed placement of the function cells; extracting a predetermined number of interconnections selected in the order of signal transmission delay from the results of the simulation made in the second step; verifying whether the interconnection to be placed would be a critical path or not; executing a detailed routing for the extracted interconnections as the critical path under conditions that a distance between the interconnection extracted as the critical path and an adjacent interconnection to the critical path is wider than a distance between the remaining interconnections; executing another detailed routing for the non-extracted interconnections at a predetermined normal pitch; executing a simulation of circuit operations under real interconnection loads calculated from resistance and capacitance of the interconnections; and verifying whether the desired performances of the circuits have be obtained.

The present invention provides a method of layout of a semiconductor integrated circuit comprising the steps of: executing a schematic placement of a plurality of function cells realizing fundamental logics in consideration of a density of distribution for a subsequent schematic routing between input/output terminals of the function cells; executing a simulation of circuit operations under virtual load conditions in consideration of a schematic length of interconnection; verifying whether desired performances can be obtained from the results of the simulations made in the second step; executing detailed placement of the function cells; extracting all of the interconnections having signal transmission delays larger than a predetermined threshold value from the results of the simulation made in the second step; verifying whether the interconnection to be placed would be a critical path or not; executing a detailed routing for the extracted interconnections as the critical paths under conditions that a distance between the interconnection extracted as the critical path and an adjacent interconnection to the critical path is wider than a distance between the remaining interconnections; executing another detailed routing for the non-extracted interconnections at a predetermined normal pitch; executing a simulation of circuit operations under real interconnection loads calculated from resistance and capacitance of the interconnections; and verifying whether the desired performances of the circuits have be obtained.

PREFERRED EMBODIMENT

Figure 5:
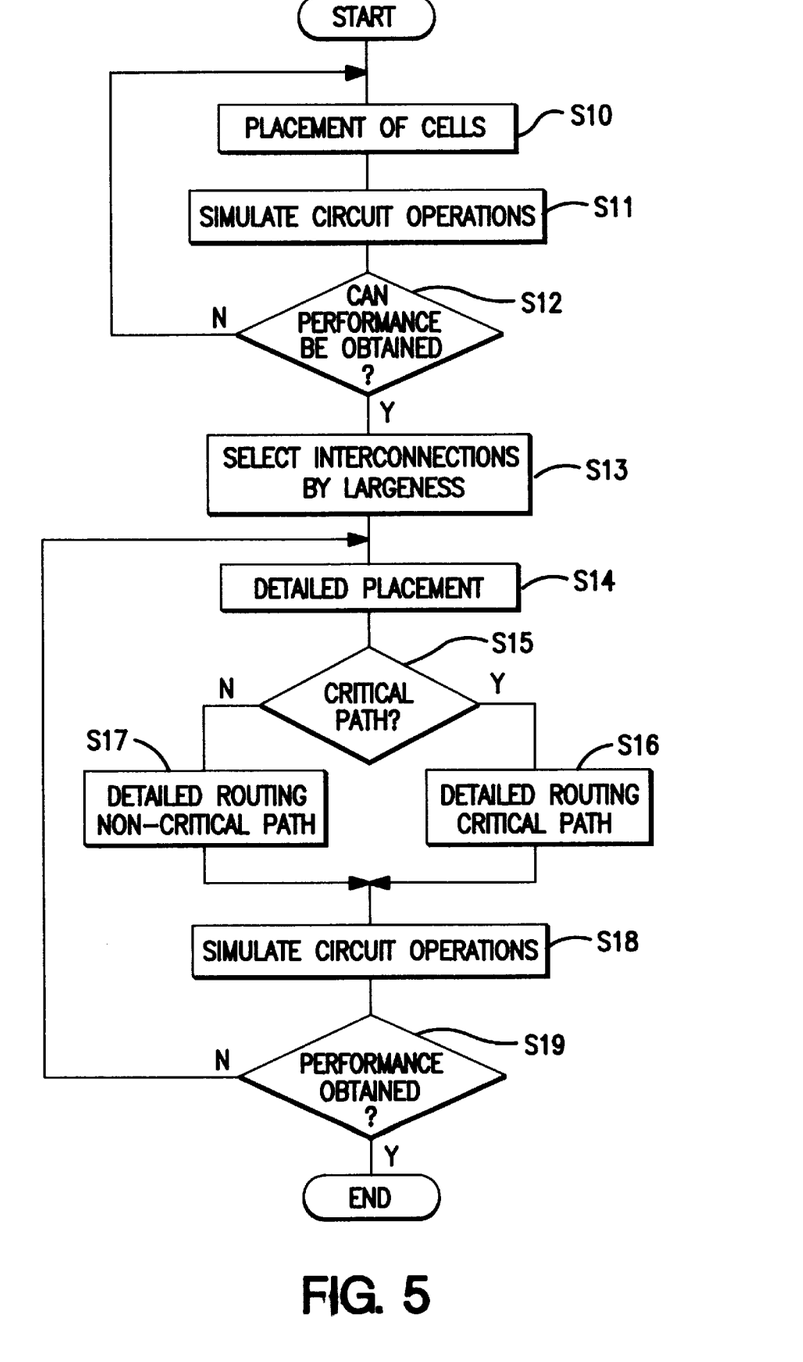
FIG. 5 is a flow chart illustrative of a novel layout method in a first embodiment according to the present invention.

A first embodiment according to the present invention will be described in detail with reference to FIG. 5 which is illustrative of a novel layout method in a first embodiment according to the present invention. In the first step, S10, a schematic placement of a plurality of function cells realizing fundamental logics is executed in consideration of a density of distribution for a subsequent schematic routing between input/output terminals of the function cells.

In the second step S11, a simulation of circuit operations is made under virtual load conditions in consideration of a schematic length such as Manhattan length of interconnection.

In the third step S12, it is verified whether the desired performances can be obtained from the results of the simulations made in the second step. For example, it is verified whether the highest operational frequency of the integrated circuits exceeds a predetermined value. If the desired performances can not be obtained, the process is back to the first step S10 in which the schematic placement and routing are again made so that the placement positions of the function cells and the positions of the input/output terminals are changed. The foregoing first to third steps are so-called floor planning and are important for realizing in an early stage the design plans of the designer in designing large scale integrated circuits. If the desired performance can be obtained, the process enters into the fourth step S13, in which a predetermined number of interconnections selected in the order of largeness of signal transmission delay are extracted from the results of the simulation made in the second step. For example, first to a hundredth interconnections from the largest delay interconnection are extracted as critical paths selected in the order of largeness of signal transmission delay. In the fifth step S14, detailed placement is made. In the sixth step S15, it is verified whether the interconnection to be placed would be a critical path or not. In the seventh step S16, a detailed routing is made for the extracted interconnections as the critical paths under the conditions that a distance between the interconnection extracted as the critical path and an adjacent interconnection to the critical path is wider by two times or more than a distance between the remaining interconnections. In the eighth step S17, another detailed routing is made for the non-extracted interconnections at a predetermined normal pitch. In the ninth step S18, circuit operations are simulated under real interconnection loads calculated from resistance and capacitance of the interconnections. In the tenth step S19, it is verified whether the desired performances of the circuits have been obtained. If obtained, then the layout processes have been completed. If not obtained, then the layout process returns back to the fifth step S14, the detailed placement is again made by changing driving capability of transistors or manually fixing the placement.

As a modification to the critical path extraction process, it is possible that all of the interconnections having signal transmission delays larger than a predetermined threshold value are extracted, whilst in the above first embodiment, a predetermined number of interconnections selected in the order of largeness of signal transmission delay are extracted.

Figure 6:
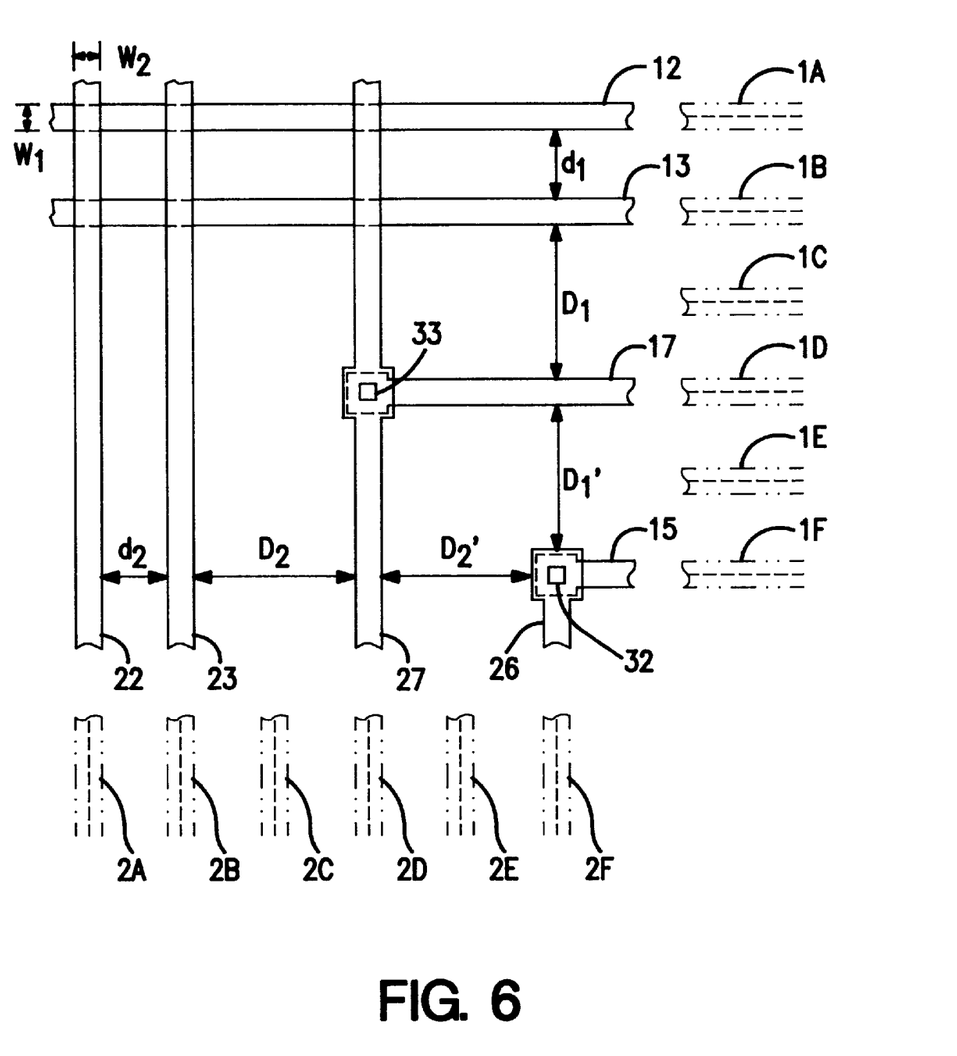
FIG. 6 is a plane view illustrative of the layout of interconnections between function cells after the novel layout processes have been completed in the first and second embodiment according to the present invention.

FIG. 6 is a plane view illustrative of the layout of interconnections between function cells after the novel layout processes have been completed in the first embodiment according to the present invention. First level interconnection channels 1A, 1B, 1C, 1D, 1E and 1F extend in the row direction at a first constant pitch "d1". Second level interconnection channels 2A, 2B, 2C, 2D, 2E and 2F extend in the column direction at a second constant pitch "d2". The second level interconnection channels 2A, 2B, 2C, 2D, 2E and 2F extend in the vertical direction to the first level interconnection channels 1A, 1B, 1C, 1D, 1E and 1F. First level non-critical path interconnections 12, 13 and 15 are provided which extend on the first level interconnection channels 1A, 1B and 1F respectively. A first level critical path interconnection 17 is provided which extends on the first level interconnection channel 1D and no interconnections are provided on the first level interconnection channels 1C and 1E so that the first level critical path interconnection 17 is distanced by "D1" and "D1'" from the first level non-critical path interconnections 13 and 15 respectively wherein "D1" and "D1'" are twice larger than "d1". The first level non-critical path interconnections 12, 13 and 15 and the first level critical path interconnection 17 have a width of "W1". Second level non-critical path interconnections 22, 23 and 26 are provided which extend on the second level interconnection channels 2A, 2B and 2F respectively. A second level critical path interconnection 27 is provided which extends on the second level interconnection channel 2D and no interconnections are provided on the second level interconnection channels 2C and 2E so that the second level critical path interconnection 17 is distanced by "D2" and "D2'" from the second level non-critical path interconnections 23 and 26 respectively wherein "D2" and "D2'" are twice larger than "d2". The second level non-critical path interconnections 22, 23 and 26 and the second level critical path interconnection 27 have a width of "W2". Through holes 32 and 33 are provided which connect the first and second level interconnections. The first and second level critical path interconnections 17 and 27 are distanced by large pitches of D1, D1', D2 and D2' from the first and second level non-critical path interconnections 13, 15, 23 and 26 adjacent to them respectively so as to reduce the parasitic capacitance of the first and second level critical path interconnections 17 and 27 and the first and second level non-critical path interconnections 13, 15, 23 and 26 adjacent to them. It is possible to make a layout of critical paths without frequent detail placement and routing processes, even the critical paths are beyond the delay value range in the conventional layout method for 0.25 micron CMOS transistor circuits. The number of novel layout processes is not more than a half of the number of the conventional layout processes. The pitch of the critical path interconnection is larger whereby the layout area is somewhat increased. Since, however, the critical path interconnections are only the minority part of all the interconnections, increase in the layout area of the interconnections may be slight.

As described above, in accordance with the present invention, the critical paths are extracted form the results of the simulations for the schematic placement and routing before the detail placement and routing are made so that the critical path interconnections with large delay of signal transmissions are largely distanced from the adjacent non-critical path interconnections to reduce the parasitic capacitance between the critical path interconnection and the adjacent non-critical path interconnection. This results in a large reduction of the parasitic capacitance. This also reduces a delay in time of the signal transmissions on the interconnections thereby allowing improvement in high frequency performances of the integrated circuits. The pitch of the critical path interconnection is larger whereby the layout area is somewhat increased. Since, however, the critical path interconnections are only the minority part of all the interconnections, the increase in the layout area of the interconnections may be slight.

Figure 7:
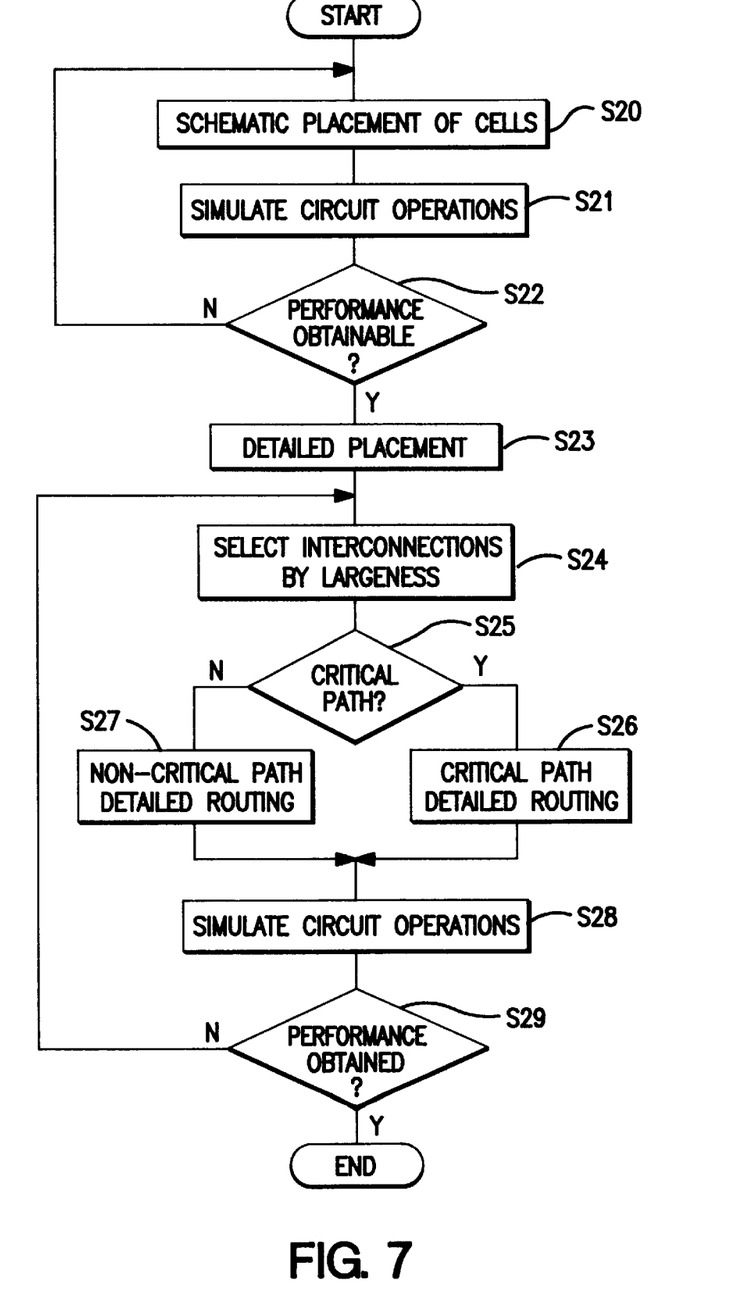
FIG. 7 is a flow chart illustrative of a novel layout method in a second embodiment according to the present invention.

A second embodiment according to the present invention will be described in detail with reference to FIG. 7 which is illustrative of a novel layout method in a first embodiment according to the present invention. In the first step, S20, a schematic placement of a plurality of function cells realizing fundamental logics is executed in consideration of a density of distribution for a subsequent schematic routing between input/output terminals of the function cells.

In the second step S21, a simulation of circuit operations is made under virtual load conditions in consideration of a schematic length such as Manhattan length of interconnection.

In the third step S22, it is verified whether the desired performances can be obtained from the results of the simulations made in the second step. For example, it is verified whether the highest operational frequency of the integrated circuits exceeds a predetermined value. If the desired performances can not be obtained, the process returned back to the first step S20 in which the schematic placement and routing are again made so that the placement positions of the function cells and the positions of the input/output terminals are changed. The foregoing first to third steps are so-called floor planning and important for realizing in early stage the design plans of the designer in designing large scale integrated circuits. If the desired performance can be obtained, the process enters into the fourth step S23, in which detailed placement is made. In the fifth step S24, a predetermined number of interconnections selected in the order of largeness of signal transmission delay are extracted from the results of the simulation made in the second step. For example, first to a hundredth interconnections from the largest delay interconnection are extracted as critical paths selected in the order of largeness of signal transmission delay. In the sixth step S25, it is verified whether the interconnection to be placed would be critical path or not. In the seventh step S26, a detailed routing is made for the extracted interconnections as the critical paths under the conditions that a distance between the interconnection extracted as the critical path and an adjacent interconnection to the critical path is wider by two times or more than a distance between the remaining interconnections. In the eighth step S27, another detailed routing is made for the non-extracted interconnections at a predetermined normal pitch. In the ninth step S28, circuit operations are simulated under real interconnection loads calculated from resistance and capacitance of the interconnections. In the tenth step S29, it is verified whether the desired performances of the circuits have be obtained. If obtained, then the layout processes have been completed. If not obtained, then the layout process is returned back to the fifth step S24, the critical path extraction is again made wherein the predetermined number of interconnections with extra ones of large delay in time of signal transmissions thereon are extracted, for example, first to a hundred-tenth interconnections from the largest delay interconnection, are extracted as critical paths from the results of the simulation made in the second step.

As a modification to the critical pass extraction process, it is possible that all of the interconnections having signal transmission delays larger than a predetermined threshold value are extracted, whilst in the above first embodiment, a predetermined number of interconnections selected in the order of largeness of signal transmission delay are extracted. In the second time, the extraction is made by lowering the predetermined threshold value.

FIG. 6 is a plane view illustrative of the layout of interconnections between function cells after the novel layout processes have been completed in the second embodiment according to the present invention. First level interconnection channels 1A, 1B, 1C, 1D, 1E and 1F extend in the row direction at a first constant pitch "d1". Second level interconnection channels 2A, 2B, 2C, 2D, 2E and 2F extend in the column direction at a second constant pitch "d2". The second level interconnection channels 2A, 2B, 2C, 2D, 2E and 2F extend in the vertical direction to the first level interconnection channels 1A, 1B, 1C, 1D, 1E and 1F. First level non-critical path interconnections 12, 13 and 15 are provided which extend on the first level interconnection channels 1A, 1B and 1F respectively. A first level critical path interconnection 17 is provided which extends on the first level interconnection channel 1D and no interconnections are provided on the first level interconnection channels 1C and 1E so that the first level critical path interconnection 17 is distanced by "D1" and "D1'" from the first level non-critical path interconnections 13 and 15 respectively wherein "D1" and "D1'" are twice larger than "d1". The first level non-critical path interconnections 12, 13 and 15 and the first level critical path interconnection 17 have a width of "W1". Second level non-critical path interconnections 22, 23 and 26 are provided which extend on the second level interconnection channels 2A, 2B and 2F respectively. A second level critical path interconnection 27 is provided which extends on the second level interconnection channel 2D and no interconnections are provided on the second level interconnection channels 2C and 2E so that the second level critical path interconnection 17 is distanced by "D2" and "D2'" from the second level non-critical path interconnections 23 and 26 respectively wherein "D2" and "D2'" are twice larger than "d2". The second level non-critical path interconnections 22, 23 and 26 and the second level critical path interconnection 27 have a width of "W2". Through holes 32 and 33 are provided which connect the first and second level interconnections. The first and second level critical path interconnections 17 and 27 are distanced by large pitches of D1, D1', D2 and D2' from the first and second level non-critical path interconnections 13, 15, 23 and 26 adjacent to them respectively so as to reduce the parasitic capacitance of the first and second level critical path interconnections 17 and 27 and the first and second level non-critical path interconnections 13, 15, 23 and 26 adjacent to them. It is possible to make a layout of critical paths without frequent detail placement and routing processes, even the critical paths are beyond the delay value range in the conventional layout method for 0.25 micron CMOS transistor circuits. The number of novel layout processes is not more than a half of the number of the conventional layout processes. The pitch of the critical path interconnection is larger whereby the layout area is somewhat increased. Since, however, the critical path interconnections are only the minority part of all the interconnections, the increase in the layout area of the interconnections may be slight.

As described above, in accordance with the present invention, the critical paths are extracted form the results of the simulations for the schematic placement and routing before the detail placement and routing are made so that the critical path interconnections with large delay of signal transmissions are largely distanced from the adjacent non-critical path interconnections to reduce the parasitic capacitance between the critical path interconnection and the adjacent non-critical path interconnection. This results in a large reduction of the parasitic capacitance. This also reduces a delay in time of the signal transmissions on the interconnections thereby allowing improvement in high frequency performances of the integrated circuits. The pitch of the critical path interconnection is larger whereby the layout area is somewhat increased. Since, however, the critical path interconnections are only the minority part of all the interconnections, the increase in the layout area of the interconnections may be slight.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of laying out a semiconductor integrated circuit comprising the steps of:

executing a schematic placement of a plurality of function cells realizing fundamental logics for a schematic routing between input/output terminals of the function cells;

executing a simulation of circuit operations under virtual load conditions in consideration of a schematic length of interconnection;

extracting any interconnections as critical paths from the results of said simulation made in said executing a simulation step; and executing detailed routing under conditions that a distance between the interconnection extracted as the critical path and an adjacent interconnection to the critical path is wider than a distance between the remaining interconnections, wherein said distance between the interconnection extracted as the critical path and the adjacent interconnection is a fixed percentage greater than said distance between the remaining interconnections.

2. The method as claimed in claim 1, wherein in said extracting step a predetermined number of interconnections selected in the order of largeness of signal transmission delay are extracted.

3. The method as claimed in claim 1, wherein in said extracting step all of the interconnections having signal transmission delays larger than a predetermined threshold value are extracted.

4. The method as claimed in claim 1, further comprising the steps of:

after executing detailed routing, executing simulation of circuit operations under real interconnection loads calculated from resistance and capacitance of the interconnections; and verifying whether desired performances of the circuits are obtained.

5. The method as claimed in claim 1, further comprising the step of executing detail placement of said function cells after executing said simulation of said circuit operations under said virtual load conditions.

6. The method as claimed in claim 1, further comprising the step of executing detail placement of said function cells after extracting any interconnections as critical paths.

7. The method of claim 1, wherein said fixed percentage is 100% so that said distance between the critical path interconnection and the adjacent interconnection is twice the distance between the remaining interconnections.

8. A method of laying out a semiconductor integrated circuit comprising the steps of:

executing a schematic placement of a plurality of function cells realizing fundamental logics in consideration of a density of distribution for a subsequent schematic routing between input/output terminals of the function cells;

executing a simulation of circuit operations under virtual load conditions in consideration of a schematic length of interconnection;

verifying whether desired performances can be obtained from the results of the simulations made in the executing a simulation step;

extracting a predetermined number of interconnections selected in the order of largeness of signal transmission delay from the results of the simulation made in the executing a simulation step;

executing detailed placement of said function cells;

verifying whether each interconnection to be placed would be a critical path or not;

executing a detailed routing for the extracted interconnections as the critical paths under conditions that a distance between the interconnection extracted as the critical path and an adjacent interconnection to the critical path is wider than a distance between the remaining interconnections, wherein said distance between the interconnection extracted as the critical path and the adjacent interconnection is a fixed percentage greater than said distance between the remaining interconnections;

executing another detailed routing for the non-extracted interconnections at a predetermined normal pitch;

executing a simulation of circuit operations under real interconnection loads calculated from resistance and capacitance of the interconnections; and verifying whether the desired performances of the circuits have been obtained.

9. The method of claim 8, wherein said fixed percentage is 100% so that said distance between the critical path interconnection and the adjacent interconnection is twice the distance between the remaining interconnections.

10. A method of laying out a semiconductor integrated circuit comprising the steps of:

executing a schematic placement of a plurality of function cells realizing fundamental logics in consideration of a density of distribution for a subsequent schematic routing between input/output terminals of the function cells;

executing a simulation of circuit operations under virtual load conditions in consideration of a schematic length of interconnection;

verifying whether desired performances can be obtained from the results of the simulations made in the executing a simulation step;

extracting all of the interconnections having signal transmission delays larger than a predetermined threshold value from the results of the simulation made in the executing a simulation step;

executing detailed placement of said function cells;

verifying whether each interconnection to be placed would be a critical path or not;

executing a detailed routing for the extracted interconnections as the critical paths under conditions that a distance between the interconnection extracted as the critical path and an adjacent interconnection to the critical path is wider than a distance between the remaining interconnections;

executing another detailed routing for the non-extracted interconnections at a predetermined normal pitch;

executing a simulation of circuit operations under real interconnection loads calculated from resistance and capacitance of the interconnections; and verifying whether the desired performances of the circuits have been obtained, wherein said distance between the interconnection extracted as the critical path and the adjacent interconnection is a fixed percentage greater than said distance between the remaining interconnections.

11. The method of claim 10, wherein said fixed percentage is 100% so that said distance between the critical path interconnection and the adjacent interconnection is twice the distance between the remaining interconnections.

12. A method of laying out a semiconductor integrated circuit comprising the steps of:

executing a schematic placement of a plurality of function cells realizing fundamental logics in consideration of a density of distribution for a subsequent schematic routing between input/output terminals of the function cells;

executing a simulation of circuit operations under virtual load conditions in consideration of a schematic length of interconnection;

verifying whether desired performances can be obtained from the results of the simulations made in the executing a simulation step;

executing detailed placement of said function cells;

extracting a predetermined number of interconnections selected in the order of largeness of signal transmission delay from the results of the simulation made in the executing a simulation step;

verifying whether each interconnection to be placed would be a critical path or not;

executing a detailed routing for the extracted interconnections as the critical paths under conditions that a distance between the interconnection extracted as the critical path and an adjacent interconnection to the critical path is wider than a distance between the remaining interconnections, wherein said distance between the interconnection extracted as the critical path and the adjacent interconnection is a fixed percentage greater than said distance between the remaining interconnections;

executing another detailed routing for the non-extracted interconnections at a predetermined normal pitch;

executing a simulation of circuit operations under real interconnection loads calculated from resistance and capacitance of the interconnections; and verifying whether the desired performances of the circuits have been obtained.

13. The method of claim 12, wherein said fixed percentage is 100% so that said distance between the critical path interconnection and the adjacent interconnection is twice the distance between the remaining interconnections.

14. A method of laying out a semiconductor integrated circuit comprising the steps of:

executing a schematic placement of a plurality of function cells realizing fundamental logics in consideration of a density of distribution for a subsequent schematic routing between input/output terminals of the function cells;

executing a simulation of circuit operations under virtual load conditions in consideration of a schematic length of interconnection;

verifying whether desired performances can be obtained form the results of the simulations made in the executing a simulation step;

executing detailed placement of said function cells;

extracting all of the interconnections having signal transmission delays larger than a predetermined threshold value from the results of the simulation made in the executing a simulation step;

verifying whether each interconnection to be placed would be a critical path or not;

executing a detailed routing for the extracted interconnections as the critical paths under conditions that a distance between the interconnection extracted as the critical path and an adjacent interconnection to the critical path is wider than a distance between the remaining interconnections, wherein said distance between the interconnection extracted as the critical path and the adjacent interconnection is a fixed percentage greater than said distance between the remaining interconnections;

executing another detailed routing for the non-extracted interconnections at a predetermined normal pitch;

executing a simulation of circuit operations under real interconnection loads calculated from resistance and capacitance of the interconnections; and verifying whether the desired performances of the circuits have been obtained.

15. The method of claim 14, wherein said fixed percentage is 100% so that said distance between the critical path interconnection and the adjacent interconnection is twice the distance between the remaining interconnections.

* * * * *